United States Patent [19]

Santos et al.

[11] Patent Number: 4,600,898
[45] Date of Patent: Jul. 15, 1986

[54] ONE-PIN CRYSTAL OSCILLATOR

[75] Inventors: Joseph T. Santos, Sunnyvale; Robert G. Meyer, Berkeley, both of Calif.

[73] Assignee: The Regents of the University of California, Berkeley, Calif.

[21] Appl. No.: 593,485

[22] Filed: Mar. 26, 1984

[51] Int. Cl.$^4$ .............................................. H03B 5/36
[52] U.S. Cl. ............................ 331/116 FE; 331/111; 368/159
[58] Field of Search ................... 331/109, 111, 116 R, 331/116 FE, 186; 368/159

[56] References Cited

U.S. PATENT DOCUMENTS

| | | | |
|---|---|---|---|
| 3,585,527 | 6/1971 | Luscher | 368/159 X |
| 3,855,552 | 12/1974 | Thanhaeuser | 331/116 R |
| 3,956,714 | 5/1976 | Luscher | 331/116 FE |
| 4,112,670 | 9/1978 | Morozumi | 368/87 |
| 4,122,414 | 10/1978 | Patterson, III | 331/116 R |

FOREIGN PATENT DOCUMENTS 2092852 2/1982 United Kingdom .

OTHER PUBLICATIONS

Eric A. Vittoz, "Quartz Oscillator for Watches", 1979, pp. 131–140.

Primary Examiner—Eugene R. LaRoche
Assistant Examiner—Robert J. Pascal
Attorney, Agent, or Firm—Fliesler, Dubb, Meyer & Lovejoy

[57] ABSTRACT

A one-pin crystal oscillator 20 is designed to be used as a clock generator for digital integrated circuits. Unlike the prior art, this oscillator requires only one package pin to connect the crystal as opposed to the usual two pin requirement and, except for the crystal, can be completely fabricated on a chip so as to require no other external components.

24 Claims, 5 Drawing Figures

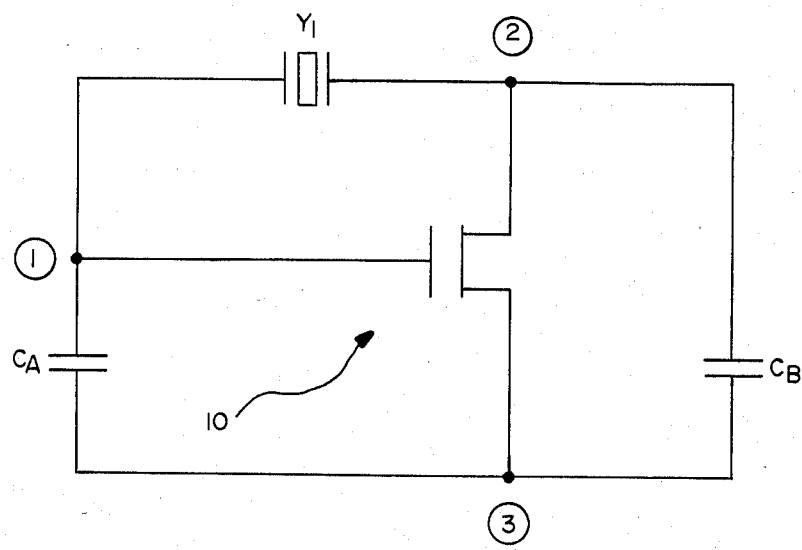
FIG.—1 PRIOR ART
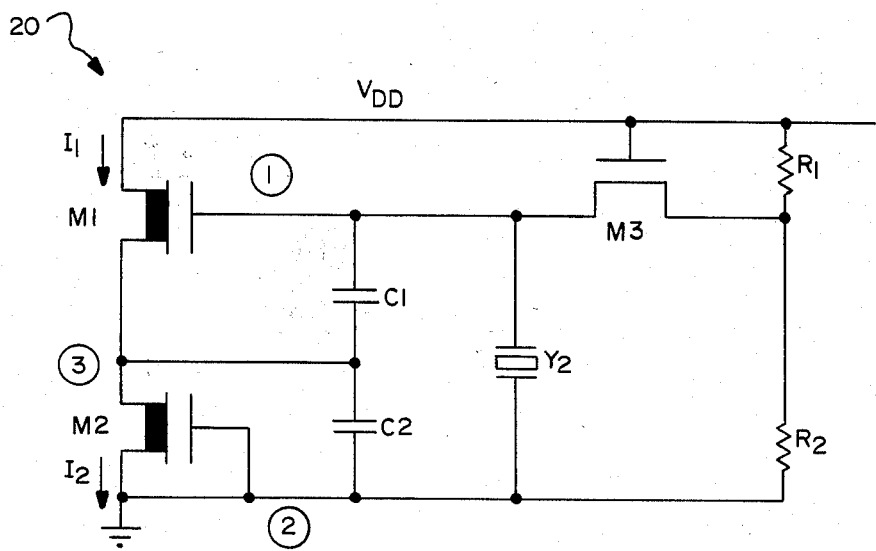
FIG.—2

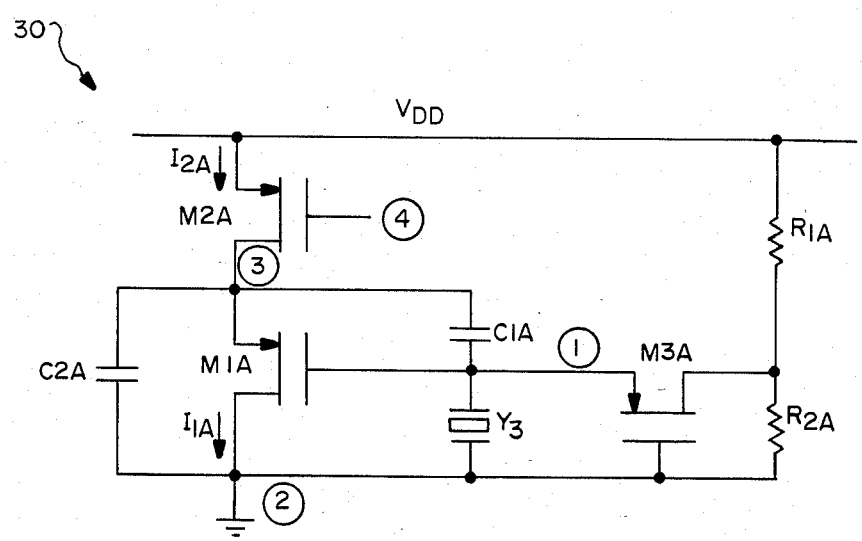
FIG.—3
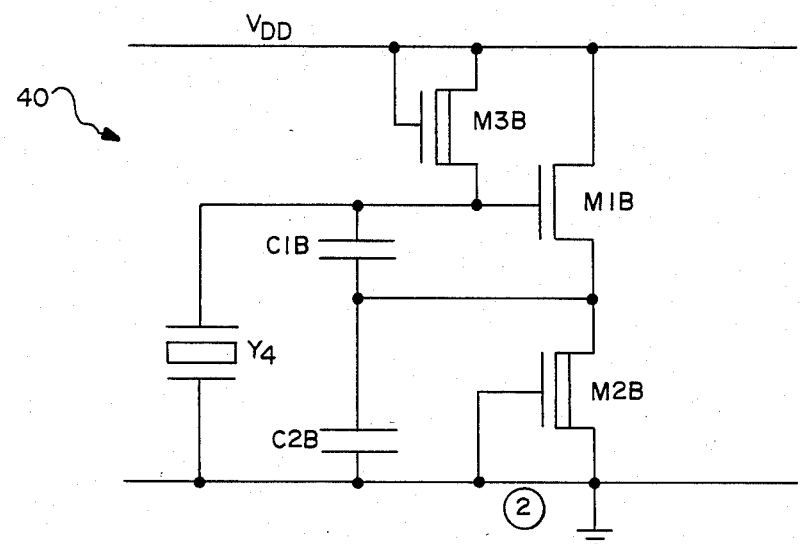
FIG.—4

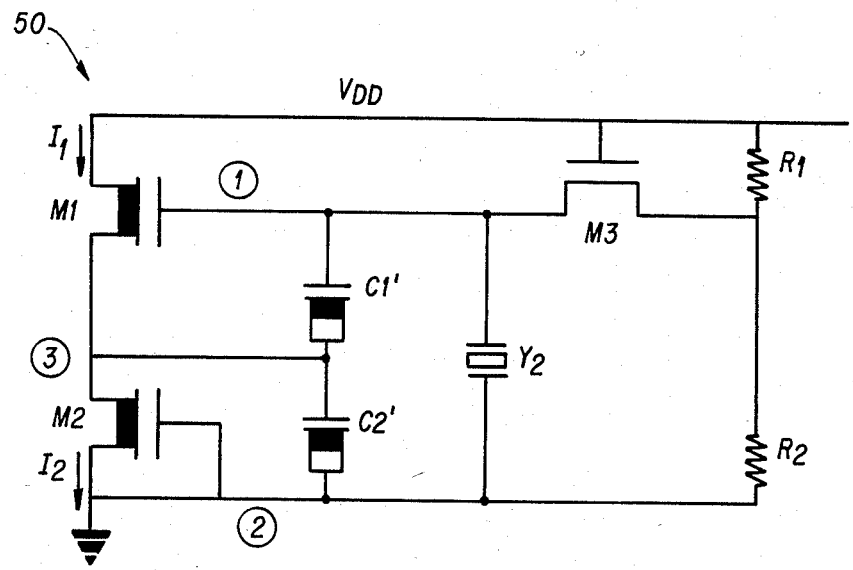
FIG.—5 ial support under Contract No. DAAG29-80-K-0067 awarded by the Department of Defense. The Government has certain right in this invention.

ONE-PIN CRYSTAL OSCILLATOR

This invention was made with government support under Contract No. DAAG29-80-K-0067 awarded by the Department of Defense. The Government has certain right in this invention.

FIELD OF THE INVENTION

The present invention relates to a crystal oscillator for use as a clock generator for digital integrated circuits.

BACKGROUND OF THE INVENTION

Crystal oscillators were developed in the 1920's. There are a number of crystal oscillator circuits presently available for use as clock generators for digital circuits. Among the most well known are the series inverter chain, the Pierce and the Colpitts oscillators. The series inverter chain is generally considered to be inferior to the Pierce oscillator because of its tendency to either oscillate on crystal overtones, oscillate without a crystal or even fail to oscillate at all. Furthermore, the series inverter chain tends to be rather large, since it must be capable of driving the external pin capacitance. The Pierce oscillator, when properly designed, has none of these problems. Both oscillators, however, have the disadvantage that they require two package pins and several external components dedicated solely to the oscillator. Although either circuit may be adequate for general use, an oscillator requiring only one package pin and no external components is preferable.

In chip design, in order to keep the size of the package manageable, the number of external connections allowed is usually less than that desired. Often signals are multiplexed on the same pin instead of given separate pins to accommodate this need. Accordingly if one of the pins required for the oscillator could be eliminated, the chip designer would have greater design flexibility. Also with no external components, the oscillator would be immune to problems associated with their improper selection and placement.

The basic oscillator block, with an inverter 10, crystal $Y_1$, and capacitors $C_A$, $C_B$, used in both the Colpitts and Pierce oscillators, is shown in FIG. 1. The capacitance $C_A$, $C_B$ are external components which have high values on the order of 30 pF. This circuit has none of the problems of the series inverter chain. At resonance, the impedance of the crystal $Y_1$ appears inductive, giving the necessary zero degrees loop phase shift for oscillations to occur. Parasitic elements along cannot have the same effect; therefore oscillations without the crystal are impossible. With only one stage of gain and a reactive feedback network which has low gain at all frequencies except the frequency of oscillation, the basic oscillator block does not have enough loop gain at the crystal overtones to allow oscillations at those frequencies. Also most important is the fact that all parasitic capacitances of the transistors, layout and external connections may be lumped into either $C_A$, $C_B$ or the case capacitance of the crystal. Since these elements resonate together during oscillation, these capacitances are driven by the resonant current, and thus a high oscillator bias current is not necessary to drive large loads.

The basic oscillator block can be implemented as follows. By grounding node 3 and biasing node 2 with a current source, the Pierce oscillator is formed. Note that two pins (at nodes 1 and 2) are required to connect the crystal to the integrated circuit. Alternately, node 1 may be grounded and node 2 biased with a current source forming the Colpitts oscillator. In this configuration, the crystal $Y_1$ is grounded on one side, and therefore only one pin of the integrated circuit need be dedicated to the oscillator and connected to node 2, as ground of the oscillator can be connected to the ground of the package. Unfortunately, in integrated form the Colpitts oscillator is difficult to bias.

The present invention is directed to overcoming the above disadvantages.

SUMMARY OF THE INVENTION

In summary, the present invention provides for the grounding of node 2 of the basic oscillator block of FIG. 1 and the biasing of node 3 with a current source to form a one-pin oscillator.

The oscillator circuit of the invention comprises a crystal, a first transistor forming one amplifier of the circuit and a second transistor interconnected in series with the first transistor forming a current source of the circuit. The oscillator circuit further includes a high impedance voltage source biasing the gate of the first transistor. The cyrstal is connected between the gate of the first transistor and a ground.

The present one-pin crystal oscillator is especially well-suited to VLSI circuits. The design features include excellent frequency stability, with no overtone oscillation tendencies nor any possibility of oscillations if the crystal is removed. The oscillator is designed such that no external components other than the crystal are required. In addition, the oscillator may be bypassed by removing the crystal and driving the circuit directly from an external source connected to the same pin. Using this design, several circuits with identical oscillators may share the same crystal, thus insuring synchronous operation.

BRIEF DESCRIPTION OF THE FIGURES

FIG. 1 is a schematic view of a basic oscillator block.

FIG. 2 is a schematic view of an embodiment of the oscillator of the invention.

FIG. 3 is a schematic view of another embodiment of the oscillator of the invention.

FIG. 4 is a schematic view of still another embodiment of the oscillator of the invention.

FIG. 5 is the schematic view of FIG. 2 with transistors substituted for the capacitors.

DETAILED DESCRIPTION OF THE PREFERRED EMBODIMENT

In FIG. 2 an embodiment of the one-pin crystal oscillator of the invention is depicted and identified by the numeral 20. This embodiment is implemented using a NMOS process.

Transistor $M_1$ is the actual gain element of the oscillator. Transistor $M_1$, in a preferred embodiment is a depletion mode FET (Field Effect Transistor). Transistor $M_2$ is the biasing current source which has a grounded gate. Transistor $M_2$ in a preferred embodiment is also a depletion mode FET. Together these elements, along with the feedback network composed of the crystal $Y_2$ and capacitors $C_1$ and $C_2$, give the necessary loop gain and phase shift for oscillations to occur.

As can be seen in FIG. 2, the drain terminal of transistor $M_1$ is connected to $V_{DD}$ with the source terminal thereof connected to a node 3 which is connected to the drain terminal of transistor $M_2$. The source of transistor M₂ is connected to ground which can be considered node 2 of the above basic oscillator block circuit. Capacitors $C_1$ and $C_2$ are connected in series between the gate of transistor $M_1$ (node 1) and the ground (node 2). The connection between capacitors $C_1$ and $C_2$ is communicated with node 3. Crystal $Y_2$ is also connected between node 1 and node 2.

Resistors $R_1$ and $R_2$ are connected between $V_{DD}$ and ground at node 2. A transistor $M_3$ is provided such that its gate is connected to $V_{DD}$, with its drain connected to the gate of transistor $M_1$ and its source connected to the line connecting resistors $R_1$ and $R_2$. In a preferred embodiment, transistors $M_3$ is an enhancement mode FET. Since a very high impedance at the gate of transistor $M_1$ is necessary, the bias voltage generated by resistors $R_1$ and $R_2$ is coupled to node 1 by transistor $M_3$ whose small-signal source-drain resistance is made large. This configuration can give an impedance at node 1 on the order of one megaohm in the preferred embodiment while keeping the die area within allowable limits.

As node 3 is not externally available, capacitors $C_1$ and $C_2$ must be integrated. In the NMOS implementation 50 of the embodiment, capacitors $C_1$ and $C_2$ are realized using the gate capacitance $C_1'$, $C_2'$ of depletion transistors biased in the linear region. This is accomplished by tying the source and drain terminals together, the capacitance being provided between the gate terminal and the tied-together source and drain terminals. The capacitors of this embodiment, as specified below, are approximately one-tenth the size of the capacitors used in the prior art.

In this embodiment, the output of the oscillator 20 may be taken from either node 1 or 3. Node 1 is preferrable because its bias voltage is known precisely, and is generally closer to the threshold of a standard inverter. Also the output amplitude at node 1 is larger, thus requiring fewer stages of gain to generate a square wave.

In a preferred embodiment:
$C_1 = 4$ pF
$C_2 = 2$ pF
$R_1 = 2$ kΩ
$R_2 = 2$ kΩ

$Y_2$ crystal parameters (a 4-MHz quartz crystal in preferred embodiment with low series resistance and low case capacitance).
$R_O = 25$ Ω (series resistance)
$C_O = 15.1$ fF (series capacitance)
$L_O = 0.1048$ H (series inductance)
$C_C = 6$ pF (capacitance between metallized electrodes of crystal)

It should be understood that other 4-MHz crystals can be used.

$M_1 = 20/10$ (W/L: Where W/L is the ratio of the width in microns to the length in microns of the gate of the fabricated FET)
$M_2 = 20/10$ (W/L)
$M_3 = 5/660$ (W/L)

The one-pin crystal oscillator of the invention can also be implemented in at least the two other ways depicted in FIGS. 3 and 4.

In FIG. 3 a CMOS process is used. This implementation has the same small-signal behavior as the embodiment of FIG. 2. The only difference is in the bias points, and thus the output signal amplitude and bias voltage. In the embodiment of FIG. 3, oscillator 30 has transistors $M_{1A}$, $M_{2A}$ $M_{3A}$ which are preferably implemented with the p-channel FETs. In this embodiment, transistor $M_{1A}$ is the actual gain element of the oscillator 30, and transistor $M_{2A}$ is the biasing current source. Transistor $M_{2A}$ is biased at node 4 by an internally generated reference. Resistors $R_{1A}$ and $R_{2A}$ generate the bias voltage for node 1. Since a very high impedance at the gate $M_{1A}$ is necessary, this bias voltage is coupled to node 1 by transistor $M_{3A}$, whose small-signal source-drain resistance is made large.

As node 3 is not externally available, capacitors $C_{1A}$, $C_{1B}$ must be integrated. In CMOS implementation, this can be accomplished by either poly-poly or metal-metal capacitors.

As can be seen in FIG. 3, the source terminal of transistor $M_{2A}$ is connected to $V_{DD}$ with the drain thereof connected to node 3 to which the source of transistor $M_{1A}$ is connected. The drain of transistor $M_{1A}$ is grounded at node 2. Capacitor $C_{2A}$ is tied between nodes 2 and 3 with capacitor $C_{1A}$ and crystal $Y_3$ provided in series between nodes 3 and 2. The point of interconnection of capacitor $C_{1A}$ and crystal $Y_3$ is connected to the gate of transistor $M_1$ and the source of transistor $M_{3A}$. The gate of transistor $M_{3A}$ is grounded at node 2. Resistors $R_{1A}$ and $R_{1B}$ are provided in series between $V_{DD}$ and node 2 with their point of interconnection connected to the source of transistors $M_3$.

Oscillator 40 in FIG. 4 is an NMOS implementation similar to FIG. 2 with the exception that the gate of transistor $M_{3B}$ is connected to $V_{DD}$ directly and $M_{3B}$ is a depletion mode transistor with transistor $M_{1B}$ being an enhancement mode transistor.

INDUSTRIAL APPLICABILITY

The operation of crystal oscillator 20 of FIG. 2 is as follows. The circuit essentially supplies energy to a crystal $Y_2$ which operates in a parallel resonant mode. The crystal $Y_2$ and capacitors $C_1$, $C_2$ operate as a feedback loop (and can be modeled as an LC circuit in an ideal situation) in order to regulate the energy provided to crystal $Y_2$. The transistor $M_3$ and the resistors $R_1$ and $R_2$ can be thought of as a single resistance in parallel with crystal $Y_2$ in order to bias the gate of transistor $M_1$. The input voltage to the feedback circuit is measured across capacitor $C_2$ and the output across capacitor $C_1$.

At resonance, crystal impedance is at a maximum, and a large feedback voltage is developed. If the frequency drifts above or below resonance, the crystal impedance decreases rapidly, decreasing feedback. Thus the crystal effectively determines feedback and stabilizes the oscillator output frequency.

In an ideal situation transistors $M_1$ and $M_2$ can be thought of as controlled current sources that either push current into or pull current from the node interconnecting capacitors $C_1$ and $C_2$. As the gate to source voltage of transistor $M_1$ increases due to increased feedback from the feedback circuit, more current is pushed to node 3 than transistor $M_2$ can handle, and the current is pushed to the node between capacitors $C_1$ and $C_2$ to energize the crystal $Y_2$. As the gate to source voltage of transistor $M_1$ decreases due to decreased feedback from the feedback circuit, less current is provided to node 3, and current is pulled from the node between capacitors $C_1$ and $C_2$ by transistor $M_2$ providing less energy to the crystal $Y_2$.

The limiting phenomenon which stabilizes oscillator output is that the transistors go into a non-linear operating region which reduces positive feedback and thereby stabilizes output amplitude.

For the circuit of FIG. 2 with the component values listed above, the parallel resonant mode frequency is about 4 MHz. It is to be understood that the frequency range for the embodiment of FIG. 2 is about 50 KHz to 20 MHz depending on the values of the components.

The operation of the other embodiments is similar to the embodiment described above.

Other objects and advantages of the invention can be obtained from a review of the figures and claims herewith.

I claim:

1. An oscillator circuit comprising:
   a crystal;
   a first transistor forming an amplifier of the circuit;
   a second transistor interconnected in series with the first transistor forming a current source of the circuit;
   a high impedance voltage source biasing the gate of the first transistor with the source of the second transistor grounded;
   said crystal connected between the gate of the first transistor and the ground; and
   wherein said first and second transistors are depletion mode field-effect transistors.

2. The oscillator of claim 1 wherein the third transistor is a field-effect transistor.

3. The oscillator of claim 2 wherein the third transistor is an enhancement mode transistor.

4. The oscillator of claim 1 including first and second capacitors connected in series between the gate of the first transistor and ground, with the interconnection of the first and second capacitors connected to the interconnection of the first and second transistors.

5. The oscillator of claim 2 wherein said fourth and fifth transistors are depletion mode field-effect transistors.

6. The oscillator of claim 2 wherein the source and drain terminals of the fourth transistor are connected together and wherein the source and drain terminals of the fifth transistor are connected together.

7. The oscillator of claim 1 wherein the second transistor has a grounded gate.

8. The oscillator of claim 5 wherein the high impedance voltage source includes a depletion mode field-effect transistor.

9. The oscillator of claim 1 with the crystal in a parallel resonance mode.

10. A one-pin oscillator circuit comprising a crystal operating in a parallel resonance mode;
    a first transistor forming an amplifier of the circuit;
    a second transistor interconnected in series with the first transistor forming a current source of the circuit;
    a high impedance voltage source biasing the gate of the first transistor with the source of the second transistor grounded;
    first and second capacitors interconnected in series between the gate of the first transistor and ground, with the interconnection of the first and second capacitors connected to the interconnection of the first and second transistors;
    said crystal connected between the gate of the first transistor and the ground; and
    wherein the first and second transistors are depletion mode field-effect transistors.

11. The oscillator of claim 10 including an oscillator output terminal provided in the connection between crystal and the gate of the first transistor.

12. The oscillator of claim 10 including an oscillator output terminal provided in the connection between the first and second transistors.

13. The oscillator of claim 10 wherein the oscillator circuit with the exception of the crystal is integrated on a semiconductor substrate.

14. The oscillator of claim 4 wherein said fourth and fifth transistors are depletion mode field-effect transistors.

15. The oscillator of claim 10 wherein said second transistor has a grounded gate.

16. An oscillator circuit comprising:
    a crystal;
    a first transistor forming an amplifier of the circuit;
    a second transistor interconnected in series with the first transistor forming a current source of the circuit;
    a high impedance voltage source biasing the gate of the first transistor with the source of the first transistor grounded and the drain of the second transistor connected to a voltage source and with the drain of the first transistor connected to the source of the second transistor;
    said crystal connected between the gate of the first transistor and the ground wherein the high impedance voltage source includes a third transistor with the gate thereof grounded, the source thereof connected to the gate of the first transistor and the drain connected to a voltage source.

17. The oscillator of claim 16 including a first capacitor connected between the gate and the source of the first transistor and a second capacitor connected between the source of the first transistor and ground.

18. The oscillator of claim 16 wherein the first and second transistors are P-channel field effect transistors.

19. The oscillator of claim 1 wherein the first and second transistors are N-channel field-effect transistors.

20. An oscillator circuit comprising:
    a crystal;
    a first transistor forming an amplifier of the circuit;
    a second transistor interconnected in series with the first transistor forming a current source of the circuit;
    a high impedance voltage source biasing the gate of the first transistor with the source of the second transistor grounded;
    said crystal connected between the gate of the first transistor and the ground; and
    wherein said high impedance voltage source includes a third transistor with the gate and source thereof connected to a voltage source and the drain connected to the gate of the first transistor.

21. An oscillator circuit comprising:
    a crystal;
    a first transistor forming an amplifier of the circuit;
    a second transistor interconnected in series with the first transistor forming a current source of the circuit;
    a high impedance voltage source biasing the gate of the first transistor with the source of the second transistor grounded;
    said crystal connected between the gate of the first transistor and the ground;
    wherein said first and second capacitors include the gate capacitance of fourth and fifth transistors, which transistors have the source and drain thereof tied together.

22. A one-pin oscillator circuit comprising a crystal operating in a parallel resonance mode;
 a first transistor forming an amplifier of the circuit;
 a second transistor interconnected in series with the first transistor forming a current source of the circuit;
 a high impedance voltage source biasing the gate of the first transistor with the source of the second transistor grounded;
 first and second capacitors interconnected in series between the gate of the first transistor and ground, with the interconnection of the first and second capacitors connected to the interconnection of the first and second transistors;
 said crystal connected between the gate of the first transistor and the ground; and
 wherein said high impedance voltage source includes a third transistor with the gate and source thereof connected to a voltage source and the drain connected to the gate of the first transistor, wherein the third transistor includes an enhancement mode field-effect transistor.

23. A one-pin oscillator circuit comprising a crystal operating in a parallel resonance mode;
 a first transistor forming an amplifier of the circuit;
 a second transistor interconnected in series with the first transistor forming a current source of the circuit;
 a high impedance voltage source biasing the gate of the first transistor with the source of the second transistor grounded;
 first and second capacitors interconnected in series between the gate of the first transistor and ground, with the interconnection of the first and second capacitors connected to the interconnection of the first and second transistors;
 said crystal connected between the gate of the first transistor and the ground;
 wherein said first and second capacitors include the gate capacitance of fourth and fifth transistors which transistors have the source and drain thereof tied together.

24. An oscillator circuit comprising:
 a crystal;
 a first transistor forming an amplifier of the circuit;
 a second transistor interconnected in series with the first transistor forming a current source of the circuit;
 a high impedance voltage source biasing the gate of the first transistor with the source of the second transistor grounded;
 said crystal connected between the gate of the first transistor and the ground; and
 wherein the first transistor is an enhancement mode transistor and the second transistor is a depletion mode transistor.

* * * * *